US012015242B2

(12) United States Patent
Otani et al.

(10) Patent No.: US 12,015,242 B2
(45) Date of Patent: Jun. 18, 2024

(54) OPTICAL MODULE (71) Applicant: Mitsubishi Electric Corporation, Tokyo (JP)

(72) Inventors: Tatsuki Otani, Tokyo (JP); Norio Okada, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 634 days.

(21) Appl. No.: 17/275,048

(22) PCT Filed: Nov. 21, 2018

(86) PCT No.: PCT/JP2018/043002
§ 371 (c)(1),
(2) Date: Mar. 10, 2021

(87) PCT Pub. No.: WO2020/105145
PCT Pub. Date: May 28, 2020

(65) Prior Publication Data
US 2021/0257808 A1 Aug. 19, 2021

(51) Int. Cl.
*H01S 5/026* (2006.01)
*H01S 5/00* (2006.01)
(Continued)

(52) U.S. Cl.
CPC ............ *H01S 5/026* (2013.01); *H01S 5/0014* (2013.01); *H01S 5/02345* (2021.01); *H01S 5/0239* (2021.01); *H01S 5/04254* (2019.08)

(58) Field of Classification Search
CPC .... H01S 5/026; H01S 5/0014; H01S 5/02345; H01S 5/0239; H01S 5/04254;
(Continued)

(56) References Cited

U.S. PATENT DOCUMENTS 7,037,001 B2 * 5/2006 Oomori ............... H01S 5/02212
372/31
7,263,112 B2 * 8/2007 Oomori ............... H01S 5/02212
372/36
(Continued)

FOREIGN PATENT DOCUMENTS

CN 101971441 B 4/2012
CN 102460861 A 5/2012
(Continued)

OTHER PUBLICATIONS

International Search Report issued in PCT/JP2018/043002; dated Feb. 5, 2019.
(Continued)

*Primary Examiner* — Vu A Vu
(74) *Attorney, Agent, or Firm* — Studebaker & Brackett PC (57) ABSTRACT The optical module which is disclosed in the present application comprises a plate-like metal stem in which a metallic lead pin is inserted in a through-hole so as to be coaxial with the through-hole and one sheet of a dielectric substrate which is equipped with a high-frequency signal line to be connected to the lead pin and a semiconductor optical integrated element, in which a semiconductor laser and an optical modulator are integrated, and which is connected to the high-frequency signal line with a bonding wire, wherein one side surface of the dielectric substrate extends in a direction perpendicular to the light axis direction of the semiconductor optical integrated element, and the side surface of the dielectric substrate is arranged in contact with a surface of the metal stem.

10 Claims, 9 Drawing Sheets (51) Int. Cl.
*H01S 5/02345* (2021.01)
*H01S 5/0239* (2021.01)
*H01S 5/042* (2006.01)

(58) Field of Classification Search
CPC .. H01S 5/02469; H01S 5/0265; H01S 5/0231; H01S 5/06226
USPC ..................................................... 372/50.21
See application file for complete search history.

(56) References Cited

U.S. PATENT DOCUMENTS

| | | | | |
|---|---|---|---|---|
| 7,274,837 | B2* | 9/2007 | Tanaka | G02B 6/4283 385/129 |
| 7,366,215 | B2* | 4/2008 | Aruga | H01S 5/02345 372/38.1 |
| 7,400,791 | B2* | 7/2008 | Kagaya | H01S 5/02325 385/129 |
| 7,991,029 | B2* | 8/2011 | Aruga | H05K 1/0243 372/29.013 |
| 8,509,575 | B2* | 8/2013 | Okada | H01S 5/02345 372/36 |
| 9,859,680 | B2* | 1/2018 | Serbicki | H01S 5/02212 |
| 9,980,379 | B2* | 5/2018 | Noguchi | H05K 1/025 |
| 10,422,862 | B2* | 9/2019 | Gnecchi | G01S 7/4814 |
| 10,673,204 | B2* | 6/2020 | Pavlov | G01S 7/4816 |
| 10,852,493 | B2* | 12/2020 | Noguchi | G02B 6/4256 |
| 2005/0139843 | A1 | 6/2005 | Sasada et al. | |
| 2006/0164817 | A1* | 7/2006 | Yoshida | H01L 31/02325 257/E31.127 |
| 2007/0053392 | A1 | 3/2007 | Moto | |
| 2011/0026548 | A1 | 2/2011 | Tamaya et al. | |
| 2012/0045161 | A1 | 2/2012 | Okada | |
| 2015/0116809 | A1 | 4/2015 | Uto et al. | |
| 2016/0352069 | A1 | 12/2016 | Kimura et al. | |

FOREIGN PATENT DOCUMENTS

| | | |
|---|---|---|
| CN | 104600559 A | 5/2015 |
| CN | 106206465 A | 12/2016 |
| JP | 2007059692 A | 3/2007 |
| JP | 2010-135687 A | 6/2010 |
| JP | 2011-197360 A | 10/2011 |
| JP | 2016225457 A | 12/2016 |
| WO | 2010140473 A1 | 12/2010 |

OTHER PUBLICATIONS

Office Action issued in TW108139218 by the Taiwanese Patent Office dated Mar. 12, 2020.
Office Action issued in TW108139218 by the Taiwanese Patent Office dated Dec. 29, 2020.
An Office Action mailed by China National Intellectual Property Administration dated Jun. 29, 2023, which corresponds to Chinese Patent Application No. 201880098516.0 and is related to U.S. Appl. No. 17/275,048; with English language translation.
An Office Action mailed by China National Intellectual Property Administration dated Oct. 25, 2023, which corresponds to Chinese Patent Application No. 201880098516.0 and is related to U.S. Appl. No. 17/275,048; with English language translation.

* cited by examiner

OPTICAL MODULE

TECHNICAL FIELD

This application relates to an optical module.

BACKGROUND ART

At present, an optical module, wherein an EAM-LD (Electro-absorption Modulated Laser) in which an Electro Absorption Modulator: EAM) and a semiconductor laser are integrated is mounted, is used for high speed optical communication. The above mentioned optical module has a configuration in which cooling is performed by cooling means such as a Peltier element so as to control a temperature of a semiconductor laser and an EAM to be constant (refer to Patent Document 1 and Patent Document 2, for example).

In a case of EAM-LD, light is modulated by applying a high frequency signal for modulating to an EAM as an optical modulator. In some cases, a high frequency signal is applied to an EAM via a bonding wire. In this case, due to an influence of parasitic capacitance or parasitic resistance in EAM, inductance of a bonding wire, etc., when a frequency becomes higher, it is more difficult to obtain impedance matching in a connecting point to an EAM.

Regarding a configuration disclosed in Patent Document 1 or Patent Document 2 in which a lead pin, which is mounted in a metal stem and penetrates an input part of high frequency so as to be coaxial with the metal stem, is used, a line impedance in a lead pin penetration part of a metal stem is 20Ω to 30Ω due to limitation of grass diameter which holds a lead pin and diameter of a lead pin, therefore it cannot establish an impedance matching with 50Ω which is general as a matching resistance. Further, a substrate on which an EAM-LD is mounted and a substrate for transmitting a high frequency signal are provided separately, therefore it is configured such that a wiring member such as wire connects between the substrates. In a part of wire between the substrates, there is a problem regarding impedance mismatch. As above mentioned, when a frequency of signal becomes higher, due to impedance mismatch, a high frequency signal is reflected at an EAM-LD and a wire part between the substrates and further is reflected at a part which penetrates a metal stem and in a case phase of high frequency signal is rotated 180 degrees when the high frequency signal is returned to the EAM-LD, gain will be cancelled so as to cause band width deterioration.

On the other hand, in optical modules using conventional cooling means, electric power for cooling is not electric power which is required for generating an optical signal, therefore, it is desired to realize an optical module which can operate without cooling, so called an uncooled optical module. Even in an uncooled optical module, only a cooling means for temperature control is not necessary, therefore, a problem regarding bandwidth deterioration cannot be resolved by configuration of uncooled.

PRIOR ART DOCUMENT

Patent Document

Patent Document 1: international Publication WO2010-140473

Patent Document 2: JP2011-197360A

SUMMARY OF THE INVENTION

Problems to be Solved by the Invention

Regarding conventional optical modules in which cooling means is used, as above mentioned, in order to make heat capacity in a cooling part small as less as possible, it is configured such that a substrate in which a semiconductor optical integrated element is mounted and a substrate for transmitting a high frequency signal are provided separately and a wiring member such as a wire connects between the substrates. It is difficult to establish an impedance matching at the wire part, the part is also a reflection point, and therefore, bandwidth deterioration of high frequency signal will be caused.

The present application discloses technology which can solve the above mentioned problems, and aims to provide the configuration which can be applied to an uncooled optical module and suppress bandwidth deterioration of high frequency signal.

Means for Solving the Problems

An optical module which is disclosed in the present application comprises a plate-like metal stem in which a metallic lead pin is inserted in a through-hole so as to be coaxial with the through-hole and one sheet of a dielectric substrate which is equipped with a high-frequency signal line to be connected to the lead pin and a semiconductor optical integrated element, in which a semiconductor laser and an optical modulator are integrated, and which is connected to the high-frequency signal line with a bonding wire, wherein one side surface of the dielectric substrate extends in a direction perpendicular to the light axis direction of the semiconductor optical integrated element, and the one side surface of the dielectric substrate is arranged in contact with a side surface of the metal stem and wherein on at least one part of the one side surface, an electrode which is common to a cathode electrode of the high-frequency signal line is formed and the electrode and a surface of the metal stem are electrically connected.

Effects of the Invention

An optical module which is disclosed in the present application has an effect to provide the configuration which can be applied to an uncooled optical module and can suppress bandwidth deterioration of high frequency signal.

DESCRIPTION OF THE EMBODIMENTS

Embodiment 1

Figure 1:
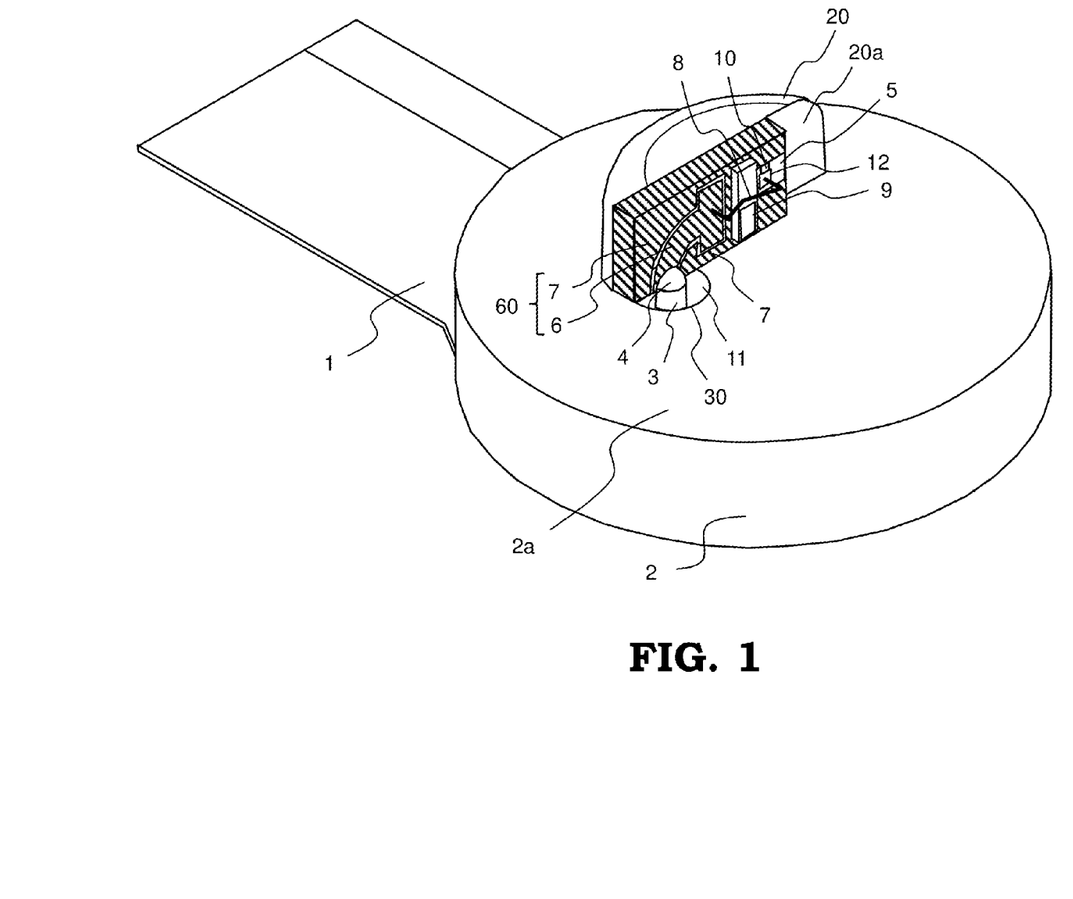
FIG. 1 is a perspective view showing the configuration of an optical module according to Embodiment 1.

FIG. 1 is a perspective view showing the configuration of an optical module according to Embodiment 1. In FIG. 1, in a metal stem 2, a lead pin 3, which is inserted in a through-hole 30 which is formed in the metal stem 2 so as to be coaxial with the through-hole 30, is provided. The lead pin 3 is fixed to the metal stem 2 via a glass material 11 which is provided so as to fill the through-hole 30. As a material of the metal stem 2 and the lead pin 3, for example, metal such as copper, iron, aluminum or stainless may be used, or metal plating or nickel plating may be applied to a surface.

On the metal stem 2, a dielectric substrate 5 is mounted, on the dielectric substrate 5, a semiconductor optical integrated element 9, in which a semiconductor laser which oscillates laser light and an optical modulator which modulates light from the semiconductor laser are integrated, is mounted. As the semiconductor optical integrated element 9, for example, an EAM-LD, in which an electro-absorption modulator in which InGaAsP based or AlInGaAs based quantum well absorption layer and a distributed feedback laser diode are integrated in monolithic, is used. Regarding a semiconductor laser, it is not limited to a distributed feedback laser diode, and as an optical modulator, a semiconductor MZ optical modulator, etc. may be used. On the metal stem 2, a substrate supporting member 20 having a surface 20a which is perpendicular to a surface 2a of the metal stem is provided, and the dielectric substrate 5 is mounted along the substrate supporting member 20 so as for a back surface to be joined to the substrate supporting member 20, for example. Further, a side where the dielectric substrate 5 of the metal stem 2 is mounted is sealed with nitrogen, for example, however, in FIG. 1, description of the configuration of sealing other than a penetration part of the lead pin 3 of the metal stem 2 is omitted. Further, in the metal stem 2, in addition to the lead pin 3 which introduces a high frequency signal, other signal line or a power supplying line will be introduced, therefore, a line introduction configuration which is similar to the introduction of the lead pin 3 is provided, however, the above mentioned is not directly related to present application, therefore, description in Figure is omitted.

Regarding conventional cooling type optical modules, in order to decrease consumption power for cooling semiconductor optical integrated elements and improve responsiveness of temperature control, a substrate on which a semiconductor optical integrated element and a substrate for transmitting a signal of high frequency from a lead pin are provided separately so as to decrease heat capacity of a cooling part. However, regarding an uncooled optical module which does not control temperatures, there is not any constraints to decrease heat capacity of a cooling part. Regarding an optical module shown in FIG. 1, in the substrate supporting member 20, a temperature control member, which controls temperatures by cooling the semiconductor optical integrated element 9, is not provided. On the dielectric substrate 5 which consists of one piece, not only the semiconductor optical integrated element 9 but also a signal line which transmits a high frequency signal from the lead pin 3 to the semiconductor optical integrated element 9 is arranged. The lead pin 3 is provided so as to input a high frequency signal for modulation from a flexible printed circuit board 1 which is arranged on a back surface of the metal stem 2 to a side where the dielectric substrate 5 is mounted. In order to transmit a high frequency signal from the lead pin 3, as a high frequency signal line 60 on the dielectric substrate 5, an anode electrode 6 and a cathode electrode 7 are formed on the dielectric substrate 5. While a distance between the anode electrode 6 and the cathode electrode 7 is kept constant, the anode electrode 6 and the cathode electrode 7 are formed on whole surface of the dielectric substrate 5, a coplanar line is constituted so as to make a high frequency signal line 60. Further, the cathode electrode 7 is electrically connected to the metal stem 2 by any method such as via a through-hole or castellation which is formed in the dielectric substrate 5 or a metal on a side surface of the dielectric substrate 5.

As a material of the dielectric substrate 5, for example, a ceramic such as ALN or alumina, or a resin such as an epoxy may be used. Further, it is preferable for the dielectric substrate 5 to be arranged in the vicinity of the lead pin 3.

One end of the lead pin 3 and one end of the anode electrode 6 on the dielectric substrate 5 are connected each other via an adhesive 4. Another end of the lead pin 3 is connected to a wiring pattern of the flexible printed circuit board 1. Another end of the anode electrode 6 and the semiconductor optical integrated element 9 are connected via a bonding wire 8, and the bonding wire 8 is connected to a conductor 12 which is formed on the dielectric substrate 5. The conductor 12 is formed on the dielectric substrate 5 being isolated from the cathode electrode 7, and a resistor 10 is connected between the conductor 12 and the cathode electrode 7.

Next, an operation will be described. In a semiconductor optical integrated element such as an EAM-LD in which a semiconductor laser and an optical modulator are integrated, a parasitic capacitance component, a parasitic resistance component and a parasitic inductance component of a bonding wire which connects to an electrode exist. When a frequency of an input signal becomes higher, it is more difficult to establish an impedance matching. On the other hand, from a view point of air tightness and reliability, regarding a penetration part of a lead pin, lead diameter is 0.3 to 0.4 mm, glass diameter is 0.7 to 0.8 mm, relative permittivity of glass $\varepsilon r$=5.5 to 7.0, and impedance is 20 to 30Ω.

Generally, in order to effectively secure a voltage amplitude, matching resistance is made to be approximately 50Ω, however, when a frequency of a signal becomes higher, it is more difficult to establish an impedance matching with a penetration part of a lead pin. Consequently, a part of a high frequency component of an electrical signal reflects at a semiconductor optical integrated element and returns to a driving side, and at a penetration part of the lead pin, a part of that reflects and returns.

When a travelling wave is designated as YO and amplitude of the travelling wave is standardized, a travelling wave will be expressed by following formula.

$$YO = \sin(\omega t)$$

A high frequency transmission in optical modules having conventional configuration which is constituted by a first dielectric substrate on which a high frequency transmission line for transmitting a high frequency signal to a semiconductor optical integrated element is formed and a second dielectric substrate on which a semiconductor optical integrated element is mounted will be considered as follows. When reflectance at a semiconductor optical integrated element is designated as ρ1, reflectance at a bonding wire which connects a semiconductor optical integrated element and the second dielectric substrate is designated as ρ2, reflectance at a bonding wire which connects the first dielectric substrate and the second dielectric substrate is designated as ρ3 and reflectance at a penetration part of a lead pin is designated as ρ4, a reflected wave Y1 will be expressed by $Y1 = \rho1 \times \rho2 \times \rho3 \times \rho4 \times \sin(\omega t - \Phi)$, and a combined wave Y2 will expressed by $Y2 = Y0 + Y1 = \sin(\omega t) + \rho1 \times \rho2 \times \rho3 \times \rho4 \times \sin(\omega t - \Phi) = A \times \sin(\omega t + \Theta)$.

Here, $A = [\{1 + \rho1 \times \rho2 \times \rho3 \times \rho4 \times \cos(\Phi)\}^2 + \{\rho1 \times \rho2 \times \rho3 \times \rho4 \times \sin(\Phi)\}^2]^{1/2}$ $\tan \Theta = -\{\rho1 \times \rho2 \times \rho3 \times \rho4 \times \sin(\Phi)\} / \{1 + \rho1 \times \rho2 \times \rho3 \times \rho4 \times \cos(\Phi)\}$ When a length from a semiconductor optical integrated element to a penetration part of a lead pin is designated as L, a frequency is designated as f, and signal speed in a transmission line is designated as c', a phase Φ of a reflected wave will be expressed by $\Phi = 2L \times (f/c') \times 2\pi$ According to the above mentioned formula, it is found out such that amplitude A of a combined wave greatly depends on reflectance and an effective electrical length between a semiconductor optical integrated element and a penetration part of a lead pin and has a frequency dependence.

Simply from a view point of wide-banding a cutoff frequency, it is preferable to make impedance of a matching circuit and that of a line matched to characteristic impedance of a penetration part of a lead pin. In order to make characteristic impedance of a penetration part of a lead pin matched to be 50Ω, generally, it is necessary such that a filling material between a lead and a metal stem is a dielectric having a relative permittivity in a range between 1.8 to 2.8, or when a filling material is glass material (εr=5.5 to 7.0) which is generally used, it is necessary for a ratio of a lead diameter to a glass diameter is in a range between 7.2 to 9.2.

Regarding an optical module according to Embodiment 1, a lead pin 3 and a semiconductor optical integrated element 9 as an EAM-LD are electrically connected with an anode electrode 6 which is formed on one piece of dielectric substrate 5 and a bonding wire 8, therefore, a bonding wire for connecting a first dielectric substrate and a second dielectric substrate, which exists conventionally, does not exist. Consequently, influence of reflected ratio ρ3 in a bonding wire which connects a first dielectric substrate and a second dielectric substrate can be disabled, therefore deterioration of gain in a high frequency band can be suppressed in comparison with conventional optical modules.

Here, in order to suppress multiple reflection which is generated between the semiconductor optical integrated element 9 and a penetration part of a lead pin, it is preferable to make line impedance of the anode electrode 6 and a resistance value of the resistor 10 to be a value which is close to characteristic impedance in a penetration part of a lead pin.

Generally, regarding an optical module, in order to monitor optical output, it is configured to arrange an optical detector such as a photo diode (PD) for detecting a laser light which emits from back surface of the semiconductor optical integrated element 9 between the semiconductor optical integrated element 9 and the metal stem 2. Regarding an optical module according to Embodiment 1, as shown in FIG. 1, an optical detector is not arranged, and the semiconductor optical integrated element 9 and the metal stem 2 are arranged so as to make a distance between a back surface of the semiconductor optical integrated element 9 and a surface 2a of the metal stem to be small as possible, as a result, height of the dielectric substrate 5 is lowered and a length of the anode electrode 6 is shortened. According to the above mentioned, deterioration of gain in a high frequency band can be suppressed.

Further, in a case where an optical detector is not provided, as a method for controlling an optical module, driving may be performed by ACC (Auto Current Control) according to a driving electrical current control of a semiconductor laser, or in a case where an optical modulator is an electro absorption modulator (EAM), an optical electrical current which is generated in modulating may be monitored, for example, an optical electrical current may be used as a signal for feed-back controlling, etc., driving may be performed by APC (Auto Power Control).

Figure 2A:
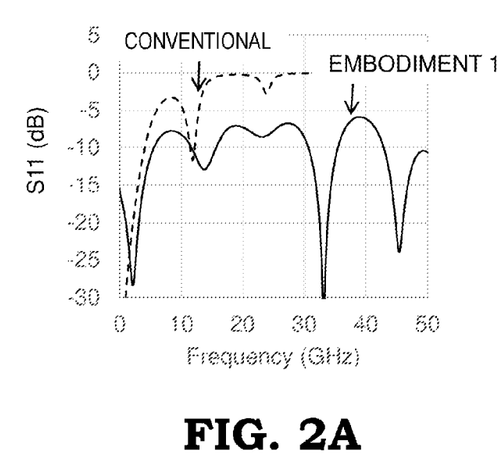
FIG. 2A and FIG. 2B are diagrams showing characteristic of an optical module according to Embodiment 1 by comparing with conventional optical modules.
Figure 2B:
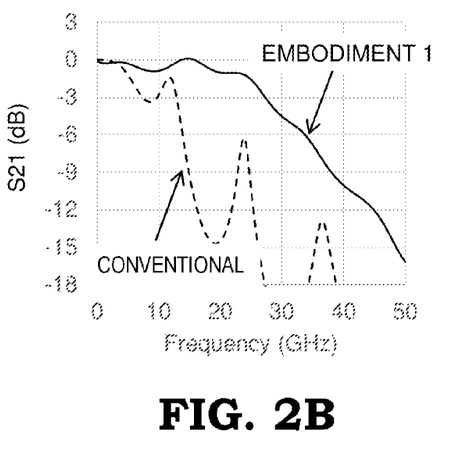

In FIG. 2A and FIG. 2B, an example of frequency characteristic (broken line) of conventional optical modules having the configuration wherein two dielectric substrates, that is, a first dielectric substrate and a second dielectric substrate are provided separately and the dielectric substrates are connected by a wire, and an example of frequency characteristic (solid line) of an optical module according to Embodiment 1 having the configuration wherein only one dielectric substrate is provided, therefore there is no wire connection between the dielectric substrates are shown. Regarding S parameter S11 (FIG. 2A) which is reflection characteristics of high frequency transmission and S21 (FIG. 2B) which is transmittance characteristics, it is found out such that in an optical module according to Embodiment 1, characteristics are improved.

Figure 3A:
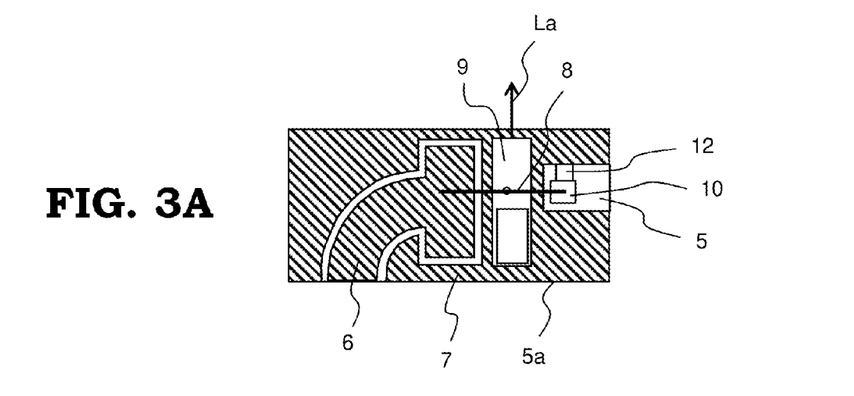
FIG. 3A and FIG. 3B are a plan view and a side view showing the configuration of a dielectric substrate of an optical module according to Embodiment 1.
Figure 3B:
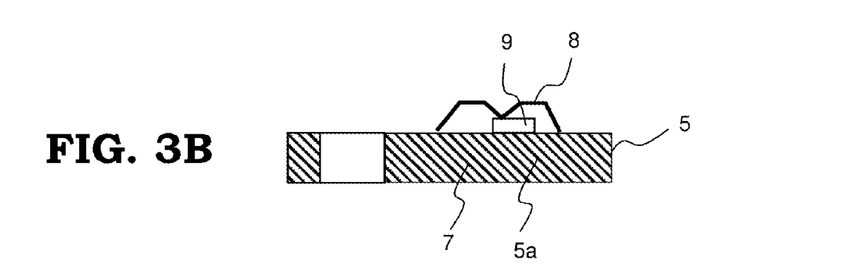

FIG. 3A is a plan view of a dielectric substrate 5 shown in FIG. 1 which is viewed from substrate surface side and FIG. 3B is a side view of the dielectric substrate 5 showing a side of one side surface 5a of the dielectric substrate 5 which is connected to a surface 2a of the metal stem 2. One side surface 5a of the dielectric substrate 5 extends in a direction perpendicular to the light axis direction La of the semiconductor optical integrated element 9. Consequently, by arranging the dielectric substrate along a substrate supporting member 20 so as for one side surface 5a of the dielectric substrate 5 to connect to a surface 2a of the metal stem, the light axis direction La of the semiconductor optical integrated element 9 is set to be a direction which is perpendicular to the surface 2a of the metal stem, therefore, adjustment of the light axis direction becomes easy.

Figure 4:
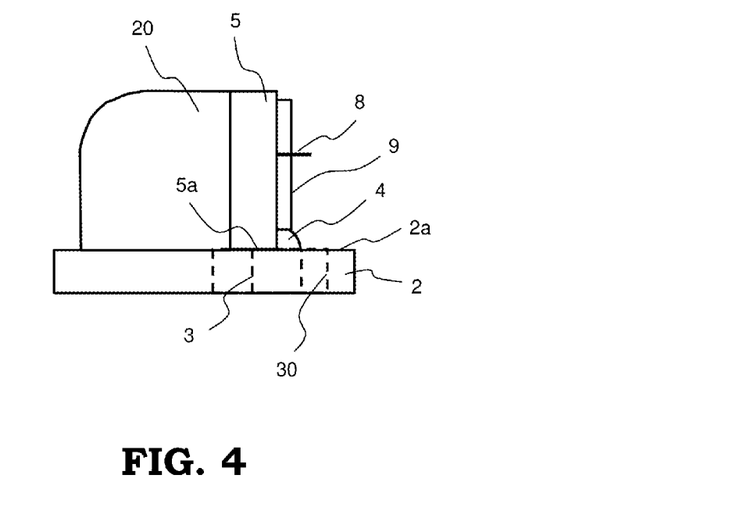
FIG. 4 is a side view showing an essential part of an optical module according to Embodiment 1.
Figure 5:
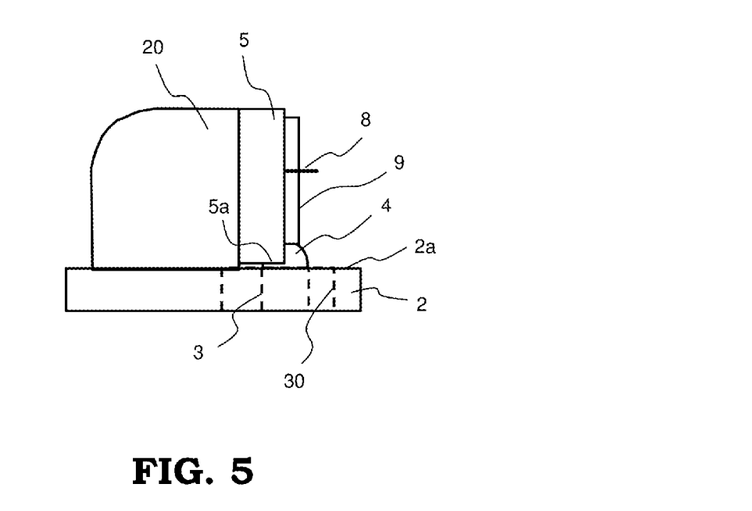
FIG. 5 is a side view showing an essential part of an optical module as a comparative example.
Figure 6A:
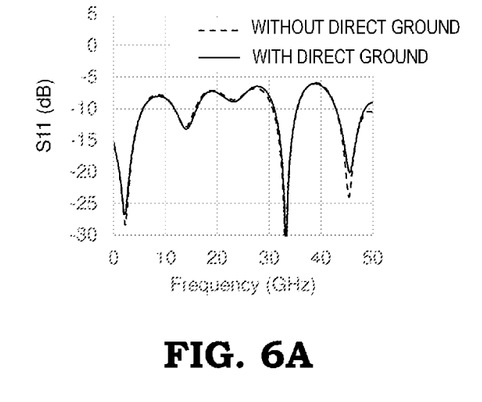
FIG. 6A and FIG. 6B are diagrams showing characteristic of an optical module according to Embodiment 1 by comparing with a comparative example.
Figure 6B:
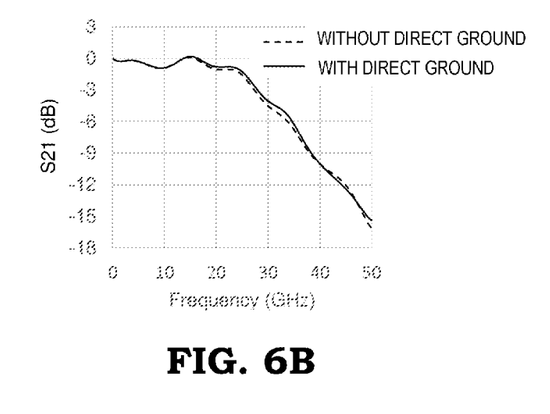

FIG. 4 is a side view which shows an enlarged part where the dielectric substrate 5 is mounted. As shown in FIG. 3A and FIG. 3B, in one side surface 5a of the dielectric substrate 5, except for a part which corresponds to a part where an anode electrode 6 is formed on a surface, a cathode electrode 7 is formed. As shown in FIG. 4, by arranging the dielectric substrate 5 so as for the one side surface 5a to connect to a surface 2a of the metal stem, the cathode electrode 7 which is formed on the one side surface 5a of the dielectric substrate 5 can be connected to the surface 2a of the metal stem and the cathode electrode 7 can be directly connected to the metal stem 2. According to the above mentioned configuration, AC-GND becomes close to a lead part which is a signal line, therefore, an inductance component of a lead part is decreased, and as a result, an optical module can be wide-banded. In FIG. 6A and FIG. 6B, examples of frequency characteristic of a case where the cathode electrode 7, which is formed on the one side surface 5a of the dielectric substrate 5 shown in FIG. 4, is directly grounded to the surface 2a of the metal stem (solid line) and a case where as a side view shown in FIG. 5, the one side surface 5a of the dielectric substrate 5 and the surface 2a of the metal stem are arranged being away, and the cathode electrode 7 is not directly grounded to the surface 2a of the metal stem (broken line) are shown. In a case where the cathode electrode 7 is directly grounded, it is found out such that a frequency characteristics is improved slightly.

As above mentioned, in an optical module according to Embodiment 1, a high frequency signal line which is connected to the lead pin 3 which penetrates the metal stem 2 and the semiconductor optical integrated element 9 in which the semiconductor laser and the optical modulator are integrated are provided on one sheet of the dielectric substrate 5 and one side surface 5a of the dielectric substrate 5 contacts to the surface 2a of the metal stem, therefore, an optical module, which can be applied to an uncooled optical module, in which a high frequency characteristics can be wide-banded and adjustment of the light axis is easy, can be realized.

Embodiment 2

Figure 7A:
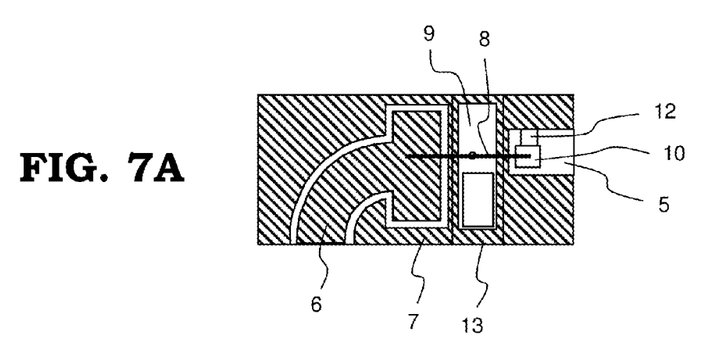
FIG. 7A and FIG. 7B are a plan view and a side view showing the configuration of a dielectric substrate of an optical module according to Embodiment 2.
Figure 7B:
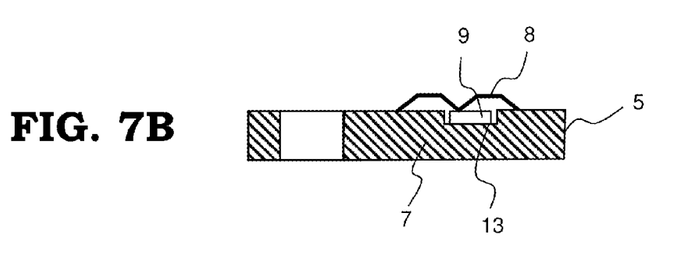
Figure 8A:
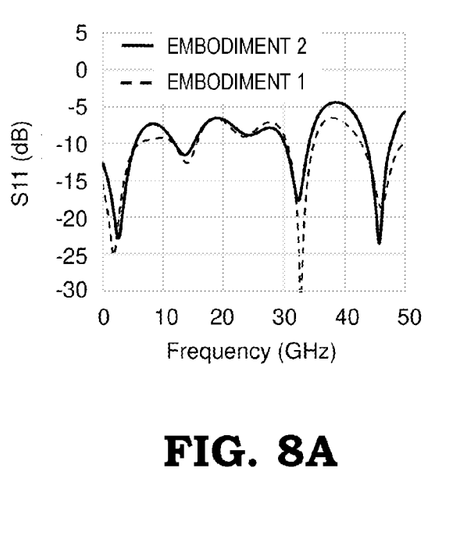
FIG. 8A and FIG. 8B are diagrams showing characteristic of an optical module according to Embodiment 2 by comparing with Embodiment 1.
Figure 8B:
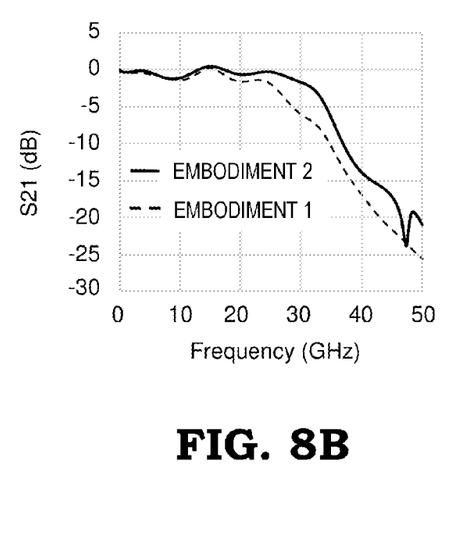

FIG. 7A is a plan view of the dielectric substrate 5 viewed from a surface showing the configuration of an optical module dielectric substrate 5 according to Embodiment 2 and FIG. 7B is a side view of the dielectric substrate 5 viewed from a side of a metal stem 2. As shown in FIG. 7A and FIG. 7B, a groove 13 is formed on a surface of the dielectric substrate 5 and in the groove 13, a semiconductor optical integrated element 9 is mounted. According to the above mentioned configuration, a length of a bonding wire 8 between an anode electrode 6, the semiconductor optical integrated element 9 and a conductor 12 can be shortened, as a result, wire inductance can be decreased and an optical module can be wide-banded. In FIG. 8A and FIG. 8B, the frequency characteristics of an optical module according to Embodiment 1 in which the groove 13 is not formed, and that of an optical module in which a length of the bonding wire 8 is shortened by forming the groove 13 are shown. It is found out such that by shortening a length of the bonding wire 8 by forming the groove 13, among S parameters, S21, which is transmittance characteristics, extends further to a high frequency and is wide-banded.

Embodiment 3

Figure 9:
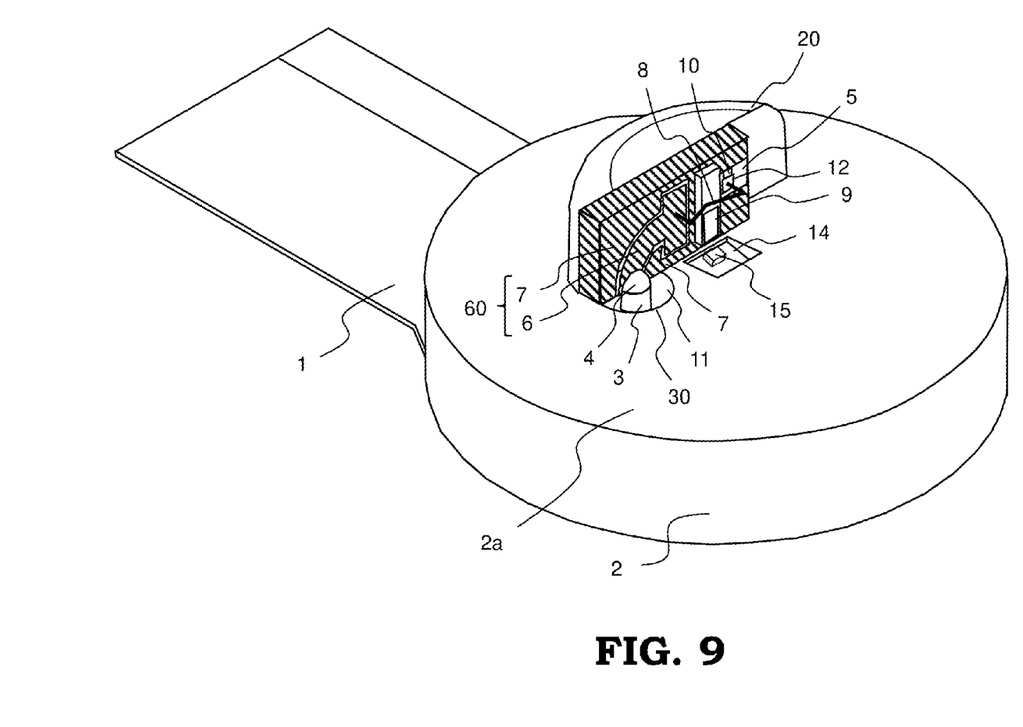
FIG. 9 is a perspective view showing the configuration of an optical module according to Embodiment 3.

FIG. 9 is a perspective view showing the configuration of an optical module according to Embodiment 3. In Embodiment 1, an optical detector is not provided, but by providing an optical detector, optical output can be stabilized easily. In Embodiment 3, an optical detector 15 is provided. In order to decrease a size of a dielectric substrate 5 in the light axis direction, the optical detector is not provided on the dielectric substrate 5, and a groove 14 is formed on a surface 2a of a metal stem 2, and in the groove 14, a photodiode which is an optical detector 15 is mounted. By providing the optical detector 15 in the groove 14, a back-surface light which leaks to a back surface of a semiconductor optical integrated element 9 can be detected without enlarging a size of the dielectric substrate 5, without lengthening a length of an anode electrode, and while suppressing bandwidth deterioration. By using output of the optical detector 15 which detects a back-surface light, an optical module can be easily driven with APC (Auto Power Control). Further, a back surface of the groove 14, in which the optical detector 15 such as a photodiode is provided, is tilted to the surface 2a of the metal stem. This is because for an operation of the semiconductor optical integrated element 9 not to be affected by back-surface light which is reflected by the optical detector 15 and is returned again, that is, for the reflected light not to be returned to the semiconductor optical integrated element 9.

Embodiment 4

Figure 10:
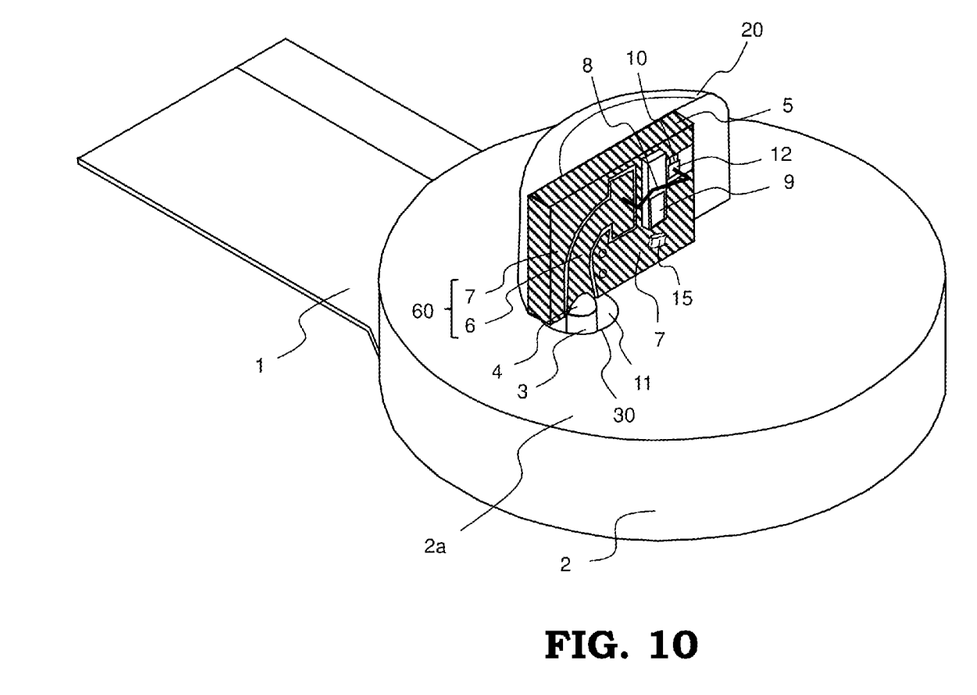
FIG. 10 is a perspective view showing the configuration of an optical module according to Embodiment 4.

FIG. 10 is a perspective view showing the configuration of an optical module according to Embodiment 4. In Embodiment 3, in order to not to enlarge a size of a dielectric substrate 5 in the light axis direction, a groove 14 is formed on a surface 2a of a metal stem 2 and in the groove 14, an optical detector 15 such as photodiode is mounted. In Embodiment 4, a size of the dielectric substrate 5 in the light axis direction becomes large slightly, however, as shown in FIG. 10, at a part which is a back surface of a semiconductor optical integrated element 9 of the dielectric substrate 5, small space is provided and the optical detector 15 is mounted on the dielectric substrate 5. In the same way as that of Embodiment 3, in Embodiment 4, it is preferable to provide an optical detector at a position which is tilted to any direction so as for a reflected light from the optical detector 15 not to return to the semiconductor optical integrated element 9. According to the above mentioned configuration, by using output of the optical detector 15 which detects a back surface light of the semiconductor optical integrated element 9, APC drive of optical module can be performed easily.

In this application, various illustrative embodiments and examples are described, however, various characteristics, aspects and functions which are described in one or a plurality of embodiments are not limited to application of specific embodiment, and one or various combination of them can be applied to embodiments. Consequently, numerous modification examples in a range of technology which is disclosed in a specification of this application are supposed. For example, a case where at least one component is modified, a case where at least one component is added or omitted, further, a case where at least one component is extracted and is combined with a component in other embodiment are included.

DESCRIPTION OF REFERENCE SIGNS 2. metal stem
2a. a surface of a metal stem
3. lead pin
5. dielectric substrate
7. cathode electrode
8. bonding wire 9. semiconductor optical integrated element
13. groove (of a dielectric substrate)
14. groove (on a surface of a metal stem)
15. optical detector
20. substrate supporting member
30. penetration hole
60. high frequency signal line

The invention claimed is:

1. An optical module comprising a plate-like metal stem in which a metallic lead pin is inserted in a through-hole so as to be coaxial with the through-hole and one sheet of a dielectric substrate which is equipped with a high-frequency signal line to be connected to the lead pin and a semiconductor optical integrated element, in which a semiconductor laser and an optical modulator are integrated, and which is connected to the high-frequency signal line with a bonding wire, wherein
one side surface of the dielectric substrate extends in a direction perpendicular to the light axis direction of the semiconductor optical integrated element, and the one side surface of the dielectric substrate is arranged in contact with a surface of the metal stem,
on at least one part of the one side surface, an electrode which is common to a cathode electrode of the high-frequency signal line is formed and the electrode and a surface of the metal stem are electrically connected, and
the dielectric substrate, which includes the semiconductor laser, the optical modulator, and the signal line to be connected to the lead pin, is a single integrated piece.

2. The optical module according to claim 1, wherein a substrate supporting member which has a perpendicular surface which is perpendicular to a surface of the metal stem and which does not have a temperature control member is provided on a surface of the metal stem and back surface of the dielectric substrate is arranged along the perpendicular surface of the substrate supporting member.

3. The optical module according to claim 1, wherein the semiconductor optical integrated element is arranged in a groove which is provided on a surface of the dielectric substrate.

4. The optical module according to claim 2, wherein the semiconductor optical integrated element is arranged in a groove which is provided on a surface of the dielectric substrate.

5. The optical module according to claim 2, wherein the semiconductor optical integrated element has a back surface of optical output which is at a side of the metal stem, and an optical detector which detects light which leaks to the back surface of the semiconductor optical integrated element is provided on a surface of the metal stem.

6. The optical module according to claim 3, wherein the semiconductor optical integrated element has a back surface of optical output which is at a side of the metal stem, and an optical detector which detects light which leaks to the back surface of the semiconductor optical integrated element is provided on a surface of the metal stem.

7. The optical module according to claim 2, wherein the semiconductor optical integrated element has a back surface of optical output which is at a side of the metal stem, and an optical detector which detects light which leaks to the back surface of the semiconductor optical integrated element is provided on the dielectric substrate.

8. The optical module according to claim 3, wherein the semiconductor optical integrated element has a back surface of optical output which is at a side of the metal stem, and an optical detector which detects light which leaks to the back surface of the semiconductor optical integrated element is provided on the dielectric substrate.

9. An optical module comprising a plate-like metal stem in which a metallic lead pin is inserted in a through-hole so as to be coaxial with the through-hole and one sheet of a dielectric substrate which is equipped with a high-frequency signal line to be connected to the lead pin and a semiconductor optical integrated element, in which a semiconductor laser and an optical modulator are integrated, and which is connected to the high-frequency signal line with a bonding wire, wherein
one side surface of the dielectric substrate extends in a direction perpendicular to the light axis direction of the semiconductor optical integrated element, and the one side surface of the dielectric substrate is arranged in contact with a surface of the metal stem,
on at least one part of the one side surface, an electrode which is common to a cathode electrode of the high-frequency signal line is formed and the electrode and a surface of the metal stem are electrically connected, and
the semiconductor optical integrated element has a back surface of optical output which is at a side of the metal stem, and an optical detector which detects light which leaks to the back surface of the semiconductor optical integrated element is provided on a surface of the metal stem.

10. An optical module comprising a plate-like metal stem in which a metallic lead pin is inserted in a through-hole so as to be coaxial with the through-hole and one sheet of a dielectric substrate which is equipped with a high-frequency signal line to be connected to the lead pin and a semiconductor optical integrated element, in which a semiconductor laser and an optical modulator are integrated, and which is connected to the high-frequency signal line with a bonding wire, wherein
one side surface of the dielectric substrate extends in a direction perpendicular to the light axis direction of the semiconductor optical integrated element, and the one side surface of the dielectric substrate is arranged in contact with a surface of the metal stem,
on at least one part of the one side surface, an electrode which is common to a cathode electrode of the high-frequency signal line is formed and the electrode and a surface of the metal stem are electrically connected, and
the semiconductor optical integrated element has a back surface of optical output which is at a side of the metal stem, and an optical detector which detects light which leaks to the back surface of the semiconductor optical integrated element is provided on the dielectric substrate.

* * * * *